United States Patent [19]

Zabala et al.

[11] Patent Number: 5,156,317
[45] Date of Patent: Oct. 20, 1992

[54] APPARATUS FOR SOLDER JOINING METAL TAPES WITH IMPROVED COVER

[75] Inventors: Robert J. Zabala, Schenectady; Bruce A. Knudsen, Amsterdam; Mark G. Benz, Burnt Hills, all of N.Y.

[73] Assignee: General Electric Company, Schenectady, N.Y.

[21] Appl. No.: 856,425

[22] Filed: Mar. 23, 1992

[51] Int. Cl.$^5$ .......................... B23K 3/00; B23K 3/06
[52] U.S. Cl. ........................ 228/4.1; 228/37; 228/43; 228/22
[58] Field of Search ............... 228/4.1, 22, 37, 43, 228/56.1, 256, 260

[56] References Cited

U.S. PATENT DOCUMENTS

| | | | |
|---|---|---|---|
| 3,352,008 | 11/1967 | Fairbanks | 228/256 |
| 3,565,318 | 2/1971 | Sillars | 228/43 |
| 4,291,450 | 9/1981 | Rhodes | 228/4.1 |
| 4,848,641 | 7/1989 | Park et al. | 228/37 |

Primary Examiner—Samuel M. Heinrich
Attorney, Agent, or Firm—James E. McGinness; James Magee, Jr.

[57] ABSTRACT

An apparatus for solder joining metal tapes to form laminated metal tapes comprises a channel means having a base, and sidewall means extending therefrom to a cover extending over the sidewall means. The sidewall means define converging channels having an entrance end for admitting the tapes spaced apart, and an exit end where facing tape surfaces can come into contact. The sidewall means separate the base and cover by a distance selected to align the tapes in the width dimension. The cover having a first section extending from the exit end, and a second section extending from the first section to the entrance end, the second section being formed with a cavity facing the channel that permits a solder flow therethrough that minimizes accumulation of particles in the channels. A solder duct means mounted on the channel means for directing molten solder into the channels to flow from the exit end to the entrance end. The solder duct means having a slot extending therethrough and aligned with the exit end. A seal means mounted on the solder duct means adjacent the slot for minimizing solder escaping from the slot while solder coated tapes pass therefrom, and a wiper means mounted on the solder duct means and positioned from the seal means removes excess solder from tapes passing through the seal means.

8 Claims, 4 Drawing Sheets

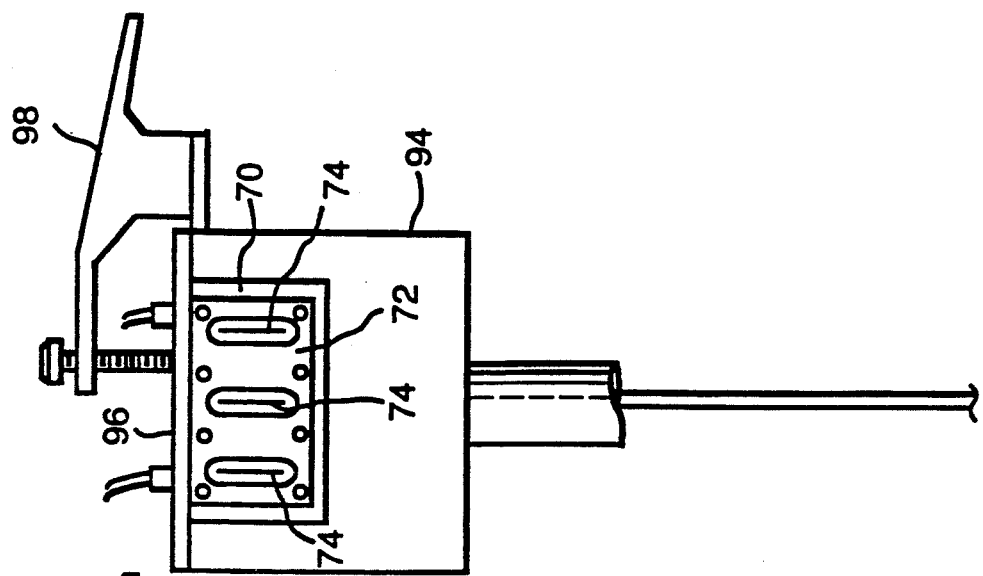
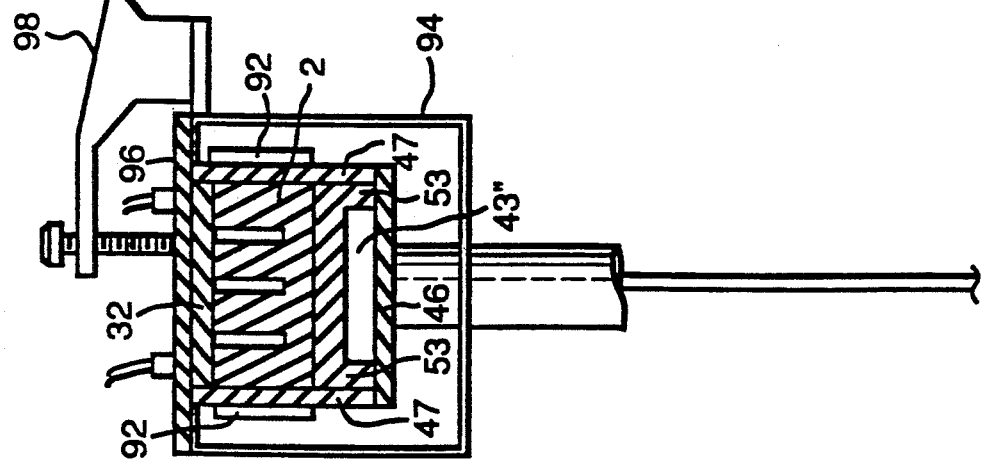
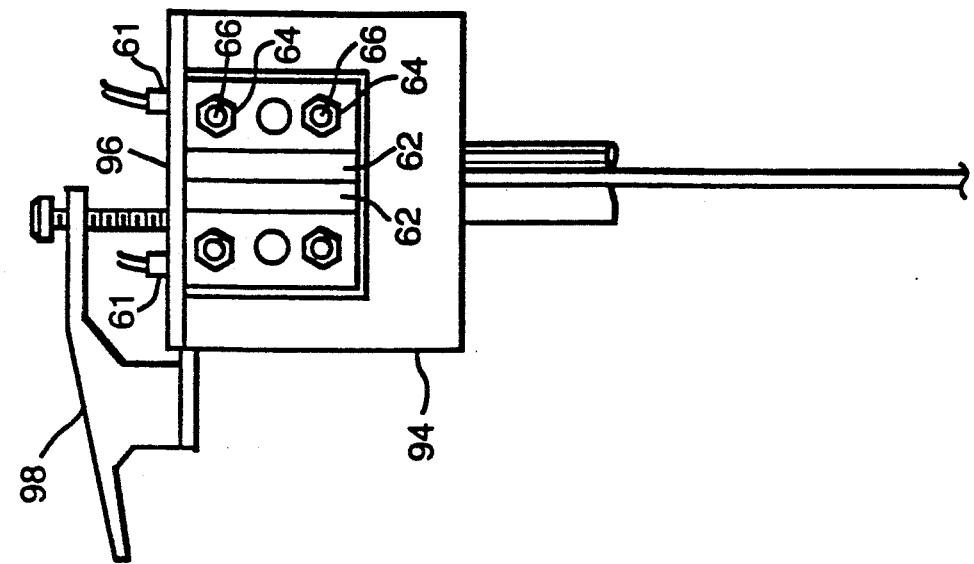

APPARATUS FOR SOLDER JOINING METAL TAPES WITH IMPROVED COVER

This application is related to copending application Ser. No. 07/767,448, filed Jan. 28, 1992 now U.S. Pat. No. 5,121,869.

BACKGROUND OF THE INVENTION

This invention relates to an apparatus for solder joining metal tapes in a continuous tape laminating apparatus.

Soldering has been defined as metal coalescence below about 427° C. As a result, soldering facilitates joining parts while minimizing damage from heating. Solder alloys are comprised of tin and lead, and the tin component reacts with metals to be joined to form a metallurgical bond. In many soldering systems, an intermetallic compound is developed at the interface between the solder and the base metal, producing an essentially complete metallurgical joint. The cleanliness and chemical composition of the surfaces to be joined are critical to the process. For example, flux can be used to insure that the base metal is sufficiently cleaned to provide adequate spread and flow of the soldering alloy to promote joint formation. However, when a flux is not used surface cleanliness, e.g., freedom from surface oxides, is critical to joint formation.

One application that has been disclosed for solder joined metal tapes is for laminated superconducting tapes, for example disclosed in U.S. Pat. No. 3,537,827. Briefly described, the laminated superconducting tape is comprised of a brittle triniobium tin superconducting layer bonded between outer laminae of non-superconductive metals having a coefficient of thermal expansion greater than that of the triniobium tin inner layer. The outer laminae are bonded integrally to each side of the triniobium tin inner layer by soldering. As a result, the triniobium tin inner layer is in a state of mechanical compression which results from the fact that the outer laminae are in a state of mechanical tension.

Uniform solder joining of the outer laminae to the relatively brittle inner layer provides benefits, such as, improved thermal conductivity for cooling of the superconducting core of the tape, improved formability of the tape, and greater resistance to handling damage. For some applications the laminated tape must have a uniform cross section, for example to enable uniform winding of the tape to form coils. Therefore, it is desirable to solder the metal tapes to form a uniform solder joint, and a laminated tape having a uniform cross-section with a smooth surface finish in a continuous operation. However, imperfections in the tapes that are to be laminated such as camber or wavy edge cause misalignment of the tapes in the width dimension, oxidized tape surface causes dewetting and poor solder bonding, and particles in the solder such as dross (tin oxide) or intermetallic compounds (CuSn) can cause non-uniform cross-sections and excessively rough surface finish defects in the laminated tape.

Excessive time at the soldering temperature, about 250° C., can produce softening of the outer laminate. Since yielding of the outer laminate will cause fracture of the relatively brittle superconductive inner laminate, it is desirable to maintain the yield strength of the outer laminate as high as possible. Therefore it is desirable to minimize the time the tapes are at the soldering temperature.

In copending application Ser. No. 07/767,448, filed Jan. 28, 1992, incorporated herein by reference, an apparatus for soldering metal tapes to form laminated tapes is disclosed. The apparatus is comprised of an alignment box defining channels therein for aligning the tapes in their width dimension. The apparatus has been used to laminate copper tapes to a triniobium tin inner laminate. To minimize oxide formation on the surface of the copper tapes, the copper tapes are precoated with electroplated solder. However, the electroplated solder coating can have a carbonaceous organic residue, and an oxide film on the surface thereof.

The organic residue and oxide film in the electroplated solder coating are washed from the surface of the copper tape with molten solder during the lamination process. A significant accumulation of particles from the organic residue and oxide occurs in the channels of the alignment box during the lamination of long lengths of tapes. Eventually, the channels can become packed with the particulate buildup, causing the tapes to jam in the channels. This not only stops the lamination process, but can lead to breakage of the tapes that are being laminated. In addition, it is possible for agglomerated particles to breakaway from the accumulation in the channels and become trapped within the laminated tape, forming unacceptable defects in the laminated tape.

One aspect of this invention is to provide an apparatus for solder joining metal tapes having means for washing particles from the apparatus to minimize particle buildup therein.

BRIEF DESCRIPTION OF THE INVENTION

The apparatus of this invention joins metal tapes to form laminated metal tapes in a continuous tape laminating apparatus. As used herein the term "tape" is a body having a length, width, and thickness dimension with major surfaces in the length and width dimension. The apparatus is comprised of a channel means having a base, and sidewall means extending therefrom to a cover extending over the sidewall means. The sidewall means define converging channels having an entrance end for admitting the tapes spaced apart, and an exit end where facing tape surfaces can come into contact. The sidewall means separate the base and cover by a distance selected to align the tapes in the width dimension. The cover having a first section extending from the exit end, and a second section extending from the first section to the entrance end. The second section being formed with a cavity facing the channel that permits a solder flow therethrough that minimizes accumulation of particles in the channels.

A solder duct means mounted on the channel means directs molten solder into the channels to flow from the exit end to the entrance end, the solder duct means having a slot extending therethrough and aligned with the exit end for permitting the tapes to pass therethrough. A seal means is mounted on the solder duct means adjacent the slot, and minimizes solder escaping from the slot while solder coated tapes pass therefrom. A wiper means is mounted on the solder duct means and positioned from the seal means for removing excess solder from tapes passing through the seal means. Preferably, the seal means and wiper means are compliant so that minor sized particles, for example up to about 20 microns, having minimal effect on the tape performance can pass therethrough.

BRIEF DESCRIPTION OF THE DRAWINGS

FIG. 8 is an end view of the apparatus in FIG. 5 showing the entrance end.

FIG. 9 is a cross section of an end view from the entrance end of the apparatus in FIG. 5.

FIG. 10 is an end view of the apparatus in FIG. 5 showing the exit end.

DETAILED DESCRIPTION OF THE INVENTION

Superconducting tapes and the method of forming the superconductor on such tapes are well known. For example, British patents 1,342,726 and 1,254,542 incorporated by reference herein, disclose improved superconducting tapes and methods of forming the improved tapes. The '827 patent referenced above discloses improvements in laminating superconductive tapes. In addition, triniobium tin tapes are well known in the art being described, for example, in "Superconducting Properties of Diffusion Processed Niobium-Tin Tape," M. Benz, I.E.E.E. Transactions of Magnetics, Vol. MAG-2, No. 4, Dec. 1966, pp 760-764, incorporated by reference herein.

A method of forming a continuous length of triniobium tin tapes is briefly described by making reference to FIGS. 1-4. A niobium tape 2 comprised of up to about 5 atomic percent of a metal selected from the group consisting of zirconium, aluminum, hafnium, titanium, and vanadium, and up to about 5000 parts per million oxygen is contacted with a molten tin bath comprised of up to about 45 weight percent copper, up to about 25 weight percent lead, and the balance tin to form a coating 4. Alternatively, the coating may be deposited onto the niobium tape at least partly by plating, or by electrolytic or chemical processes.

Figure 1:
FIG. 1 is a side view of a niobium tape.
Figure 2:
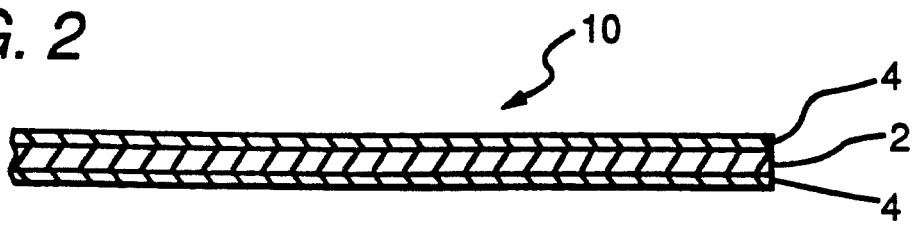
FIG. 2 is a side view of a niobium tape coated with a tin alloy.
Figure 3:
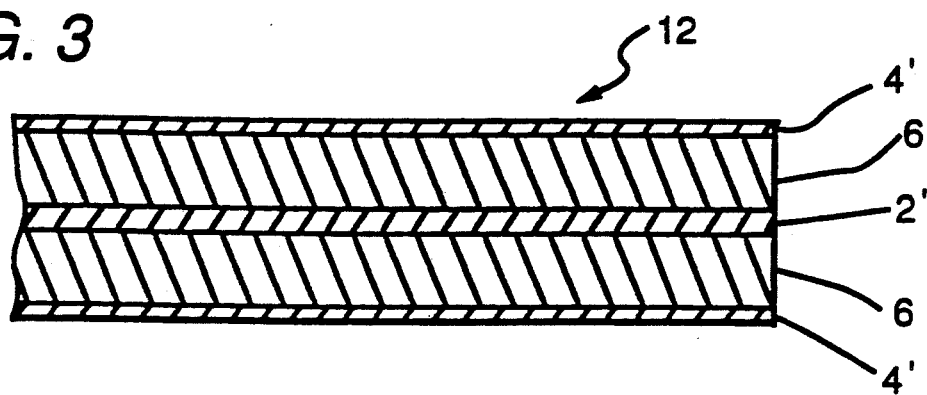
FIG. 3 is a side view of a reaction annealed triniobium tin tape.
Figure 4:
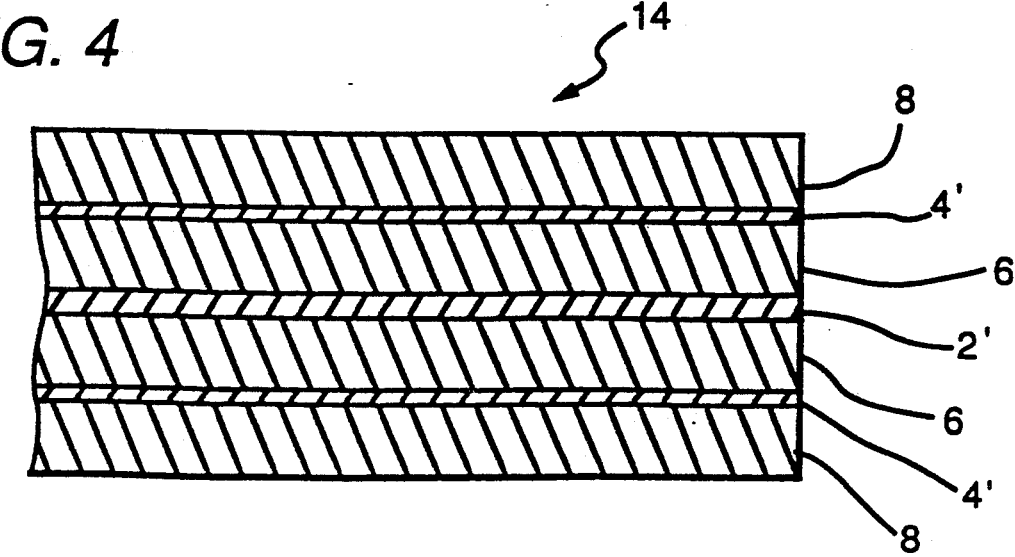
FIG. 4 is a side view of a reaction annealed triniobium tin tape with non-superconducting outer laminae.

The coated niobium tape 10 is reaction annealed at about 850° to 1100° C. to react the niobium substrate with the coating and form laminae 6 of triniobium tin on triniobium tin tape 12. Excess coating 4', as shown in FIG. 3, covers the triniobium tin laminae 6. Tin reacts with niobium to form the triniobium tin, and excess coating 4' becomes enriched in any copper or lead that was in coating 4. The remaining niobium tape 2' is reduced in thickness from reaction with the coating 4 to form the triniobium tin laminae 6. Non-superconducting outer laminae 8 are bonded to the triniobium tin tape 12 by soldering to form a laminated triniobium tin tape 14 having improved strength and formability. The apparatus of this invention is suitable for solder joining the outer laminae 8 continuously onto triniobium tin tape 12.

Figure 5:
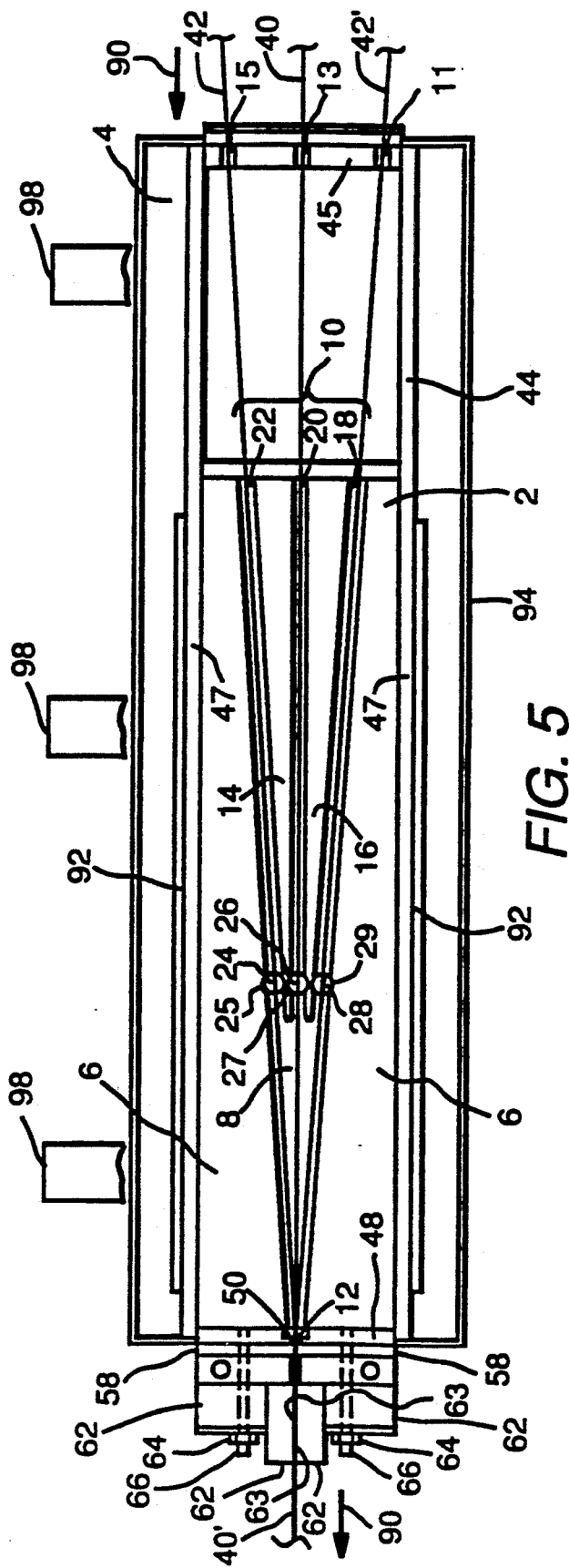
FIG. 5 is a cross section of a top view of an apparatus for solder joining metal tapes.
Figure 6:
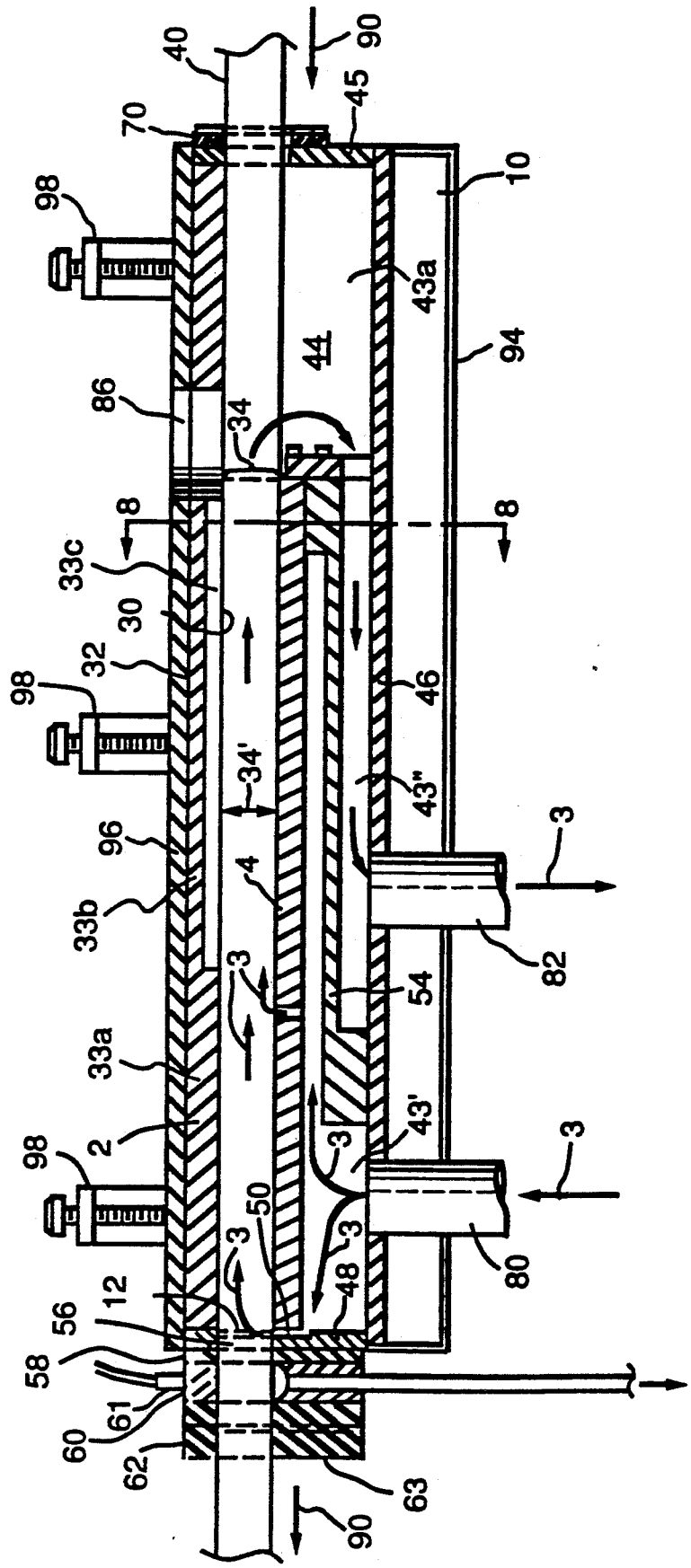
FIG. 6 is a cross section of a side view of the apparatus in FIG. 5.

Referring to FIGS. 5 and 6, the apparatus is comprised of a rectangular channel means 2 formed from a material resistant to reaction with molten solder, such as tool steel or stainless steel. Preferably, the tool steel has an adherent oxide surface layer, such as a blue oxide formed thereon. The channel means 2 has a base 4, and sidewall means 6 extending therefrom to a cover 32 defining converging channels 8 therein. Converging channels 8 have an entrance end 10 for accepting tapes spaced apart, and narrow to an exit end 12 where facing tape surfaces can come into contact. Inner sidewalls 14 and 16 of the sidewall means 6 define subchannels 18, 20, and 22 that are spaced at the entrance end 10, and converge into one channel before the exit end 12, forming converging channels 8. The width of subchannels 18, 20, and 22, i.e., the space between sidewall means 6, is greater than the thickness of the tapes to be joined. For example, a subchannel width of about 3 millimeters is suitable for tapes having a thickness of about 20 to 200 microns.

Figure 7:
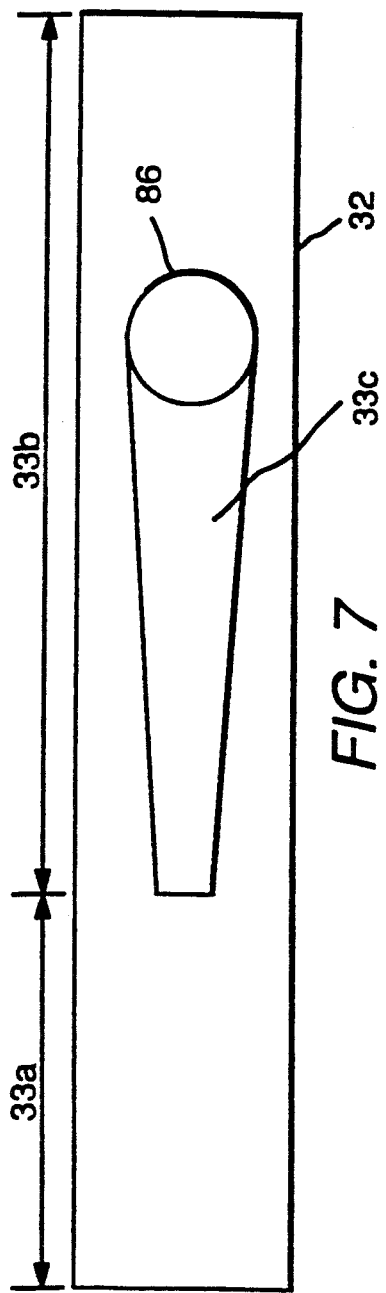
FIG. 7 is a view of a cover for the apparatus in FIG. 5

Referring to FIG. 7, cover 32 extends over sidewall means 6, and is comprised of a first section 33a extending from exit end 12, and second section 33b extending from first section 33a to the entrance end 10. The first section 33a of cover 32 extends over sidewall means 6 at imaginary plane 30. Tapes passing through converging channels 8 are constrained between base 4 and the first section 33a of cover 32 so they are aligned in the width dimension. The second section 33b of cover 32 is formed to have a cavity 33c, also shown in FIG. 6, extending over a section of converging channels 8 to permit an increased flow of solder through the channels and over the inner sidewalls 14 and 16 that provides for the removal of particles within the channels to minimize the accumulation of deposits on the sidewall means 6.

For example, in the embodiment shown in FIG. 7, cavity 33c extends over the subchannels 18, 20, and 22 of the converging channels 8, and extends past the entrance end 10. A viewing port 86 extends through cover 32 at a position over the entrance end 10 of channel means 2, and cavity 33c extends into viewing port 86. Cavity 33c is deep enough to provide for the increased flow of molten solder so that particles can be washed from the converging channels 8 instead of accumulating within the channels. For example, a cavity 33c having a depth of about 4.8 millimeters in a cover means 32 having a thickness of about 9.5 millimeters was found to be suitable to provide the desired flow of solder.

Solder flows through the converging channels 8 and over inner sidewalls 14 and 16 facing cavity 33c to provide an improved counter current washing flow that removes particles such as oxide, intermetallics, and organics from the channels so that the particles do not accumulate within the converging channels 8 to form deposits that can block the channels. For example, copper tapes precoated with electroplated solder are passed through subchannels 18 and 22 of the converging channels 8, and the particles of oxide and organic residue from the electroplated solder coating are washed from the copper tapes. The organic residue has a high buoyancy and floats to the top of the solder, i.e., into channel 33c where it can be washed from subchannels 18 and 22. When cover 32 was not formed with cavity 33c, but extended over sidewall means 6 at plane 30, shown in FIG. 6, it was found that the organic residue accumulated more readily on the cover and sidewall means facing subchannels 18 and 22. In addition, the improved solder flow through cavity 33c minimizes redepositing on the tapes of breakaway agglomerated particles from the sidewall means 6 and cover 32.

Referring to FIG. 5, a triniobium tin tape 40, can be laminated with tapes of copper 42 and 42' to form laminated tape 40'. Bending or mechanical abrasion of the triniobium tin tape 40 is minimized since there is no bending or contact with rollers or shoes within the laminating apparatus of this invention. FIG. 6 is a side view cross-section at the centerline of the channel means where inner tape 40 can extend through the channel means 2.

Base 4 has bores 24, 26, and 28 extending therethrough and positioned between inner tapered walls 14 and 16, of sidewall means 6 to communicate with subchannels 18, 20, and 22 of converging channels 8. Preferably, the diameter of bores 24, 26, and 28 is larger than the width of subchannels 18, 20, and 22, so that the bores extend into sidewall means 6 to form concave surfaces 25, 27, and 29 in the sidewall means. The bores extended into the sidewalls ensure that solder flowing through the bores and into the subchannels flows on both sides of the tapes passing therethrough. As a result, wetting of solder on both tape surfaces is promoted, and contact between the tapes and the sidewalls or inner walls is minimized.

Sidewall means 6 extend a preselected distance 34 from base 4 to imaginary plane 30, shown in FIG. 6. The preselected distance 34 is slightly larger than the width 34' of the tapes that are to be joined in the channel means 2. This preselected distance 34 determines the registry of the laminated tapes. The more distance 34 exceeds the width 34' of the tapes, the more disregistry can be tolerated in laminating the tapes, i.e., the more shape imperfections such as camber in the tape can be tolerated. For example, the preselected distance 34 can be about 625 microns greater than the width 34' of tapes 40, 42, and 42' so that the alignment of the tape edges does not vary by more than 625 microns.

Referring to FIG. 6, a rectangular housing 44 contains channel means 2 mounted on a solder duct means for directing molten solder into the exit end 12 of converging channels 8 and bores 24, 26, and 28 to flow from the exit end 12 to the entrance end 10 of channels 8 as shown by arrows 3, and means for collecting and draining molten solder flowing from the entrance end 10 of channel means 2.

Rectangular housing 44 is comprised of a bottom plate 46, end plates 45 and 48, and sidewalls 47 (shown in FIG. 9) extending from bottom plate 46 to form an inner cavity. Base plate 46 extends beyond the entrance end of channel means 2, and the sidewalls 47 and first end plate 45 extend therefrom to enclose a first cavity section 43a for collecting molten solder flowing from entrance end 10. First end plate 45 has rectangular holes 11, 13, and 15 (shown in FIG. 5) extending therethrough. Rectangular holes 11, 13, and 15 are larger than the cross-section of the tapes, and aligned with imaginary planes extending from subchannels 18, 20, and 22. Channel means 2 is mounted on a duct piece having sidewalls 53 (shown in FIG. 9), and a divider wall 54 therebetween separating the portion of the inner cavity below channel means 2 into two duct sections 43' and 43''. Solder enters channel means 2 through first duct section 43', and drains from cavity section 43a through second duct section 43''.

Second end plate 48 is mounted at the end of housing 44 opposite the first end plate 45, and adjacent exit end 12. A notch 50 formed in second end plate 48 is aligned with and extends below exit end 12 to provide communication between exit end 12 and first duct section 43'.

A slot 56 extending through second end plate 48 at notch 50 is larger than the laminated tape cross-section and is aligned with exit end 12 to provide for passage of the laminated tape therethrough.

A seal means 58 is mounted on the second plate 48 over slot 56 to minimize solder escaping from slot 56 while allowing solder coated tapes to pass therethrough. A suitable seal means 58 can be formed from a resilient material resistant to molten solder, such as silicone rubber or TEFLON synthetic resin polymer. For example, a sheet of silicone rubber is razor cut on a line to form a slit aligned with slot 56. A suitable silicone sheet is about 3 millimeters thick, and is at least large enough to extend over and beyond slot 56. Optionally, a second drain means 60 formed from material resistant to molten solder such as stainless steel is mounted adjacent seal means 58 and provides for draining of solder that passes through seal means 58. Conventional resistance heating rods 61 in second drain means 60 heat the drain means so that solder escaping from seal means 58 will drain therefrom.

A wiper means 62 is positioned from the seal means to remove excess solder from the tapes exiting the seal means by mounting adjacent the second drain means 60. Wiper means 62 can be formed from any material resistant to molten solder and rigid enough to wipe excess solder from the laminated tape. Suitable wiper means 62 can be formed from metal such as steel, iron, nickel alloys, and the like, fiberglass, TEFLON synthetic resin polymer, silicone rubber, and boron nitride. Preferably, wiper means 62 is formed from a material that is also compliant, such as the silicone rubber. A suitable silicone rubber is temperature resistant to about 250° C., and has a durometer hardness of at least about shore A 40. A suitable silicone rubber is GE RTV silicone rubber, or high temperature gasket GEC560, GE, Waterford, N.Y.

Wiping means 62 is configured to present a wiping surface 63 that extends beyond the width of tape 40, and from second drain 60 a distance sufficient to wipe excess solder from laminated tape 40', for example, about 2 centimeters. Wiping means 62 is formed to have a smooth wiping surface 63 to apply a uniform and even pressure across the surface of laminated tape 40' facing wiping surface 63. For example, wiping means 62 formed from silicone rubber can be cast as a monolithic L-shaped member, or two sheets of silicone rubber sheet can be joined together with the RTV silicone rubber to form the L-shaped member shown in FIG. 5. It is further contemplated that wiping means 62 can be configured as two rollers (not shown) positioned to apply a compressive force to laminated tape 40' after seal means 58 to remove excess solder from the laminated tape. Preferably, the rollers have at least an outer layer of a compliant material such as the silicone rubber bonded on the roller to permit small particles, for example up to about 20 microns, on the laminated tape 40' to pass through the wiping means without causing a substantial increase in the stress applied to the tape. Excess solder wiped from the laminated tape flows into and drains from second drain means 60.

Mounting bolts 66 (shown on FIGS. 5 and 10) on second end plate 48 extend therefrom through aligned holes in seal means 58, drain means 60, and wiper means 62. Nuts 64 threaded onto bolts 66 are tightened to bias seal means 58, drain means 60, and wiper means 62 into sealing engagement with second end plate 48.

Means for providing a preselected atmosphere over the channel means 2 are further shown by making reference to FIGS. 6 and 8. A silicone sheet 70 is mounted on first end plate 45 by bolted attachment through metal cover plate 72. Silicone sheet 70 has slits 74 extending therethrough and in alignment with the rectangular holes 11, 13, and 15 in the first end plate. Cover plate 32 configured to extend between end plates 45 and 48, and sidewalls 47 is mounted on the sidewall means 6 of channel means 2. Preferably, housing 44 is assembled with molten solder resistant seals, for example of GERTV red high temperature silicone rubber such as RTV 106, between the base, side walls, end plates and cover. Optional, viewing port 86 extending through cover 32 at a position over the entrance end of channel means 2 has a mating cylindrical tube (not shown) extending therefrom to a viewing glass sealed thereon. A gas inert to the molten solder such as nitrogen or argon can be introduced into housing 44 through a conventional gas valve (not shown) extending from the cylindrical tube.

Optionally, housing 44 has conventional heaters 92 such as calrod heaters attached thereto to maintain the temperature of the housing at the soldering temperature. The heaters 92 and housing 44 are then enclosed in an outer housing 94. Conventional insulation such as fiberglass or Fiberfrax alumina fibers can be placed between housing 44 and outer housing 94. Outer lid 96 configured to mate with housing cover 32, and extend over housing 44 and outer housing 95 is sealed thereon with the RTV silicone rubber. Conventional clamps 98 bias outer lid 96 and housing cover 32 against housing 44 to form a seal that minimizes leakage of molten solder flowing in housing 44.

In operation, a conventional molten metal pump system provides a flow of molten solder through pipe 80 (shown in FIG. 6) and into first duct 43'. Suitable molten solder pump systems such as a wave solder pump system can be obtained from Wenesco, Chicago, Ill. The molten solder passes from first duct 43' through notch 12 and bores 24, 26, and 28 into converging channels 8 flowing in the direction from the exit end 12 to the entrance end 10 as shown by arrows 3. The tapes 40, 42, and 42' enter the housing 44 at seal means 70 and enter the channel means 2 at the entrance end 10, passing in the direction of arrow 90. In other words, the molten solder passes in the direction of arrows 3 counter-current to the direction 90 that the tapes are passing.

The counter-current solder flow provides a washing action that washes particles such as dross and copper-tin intermetallics from the converging channels and into the cavities 33c and 43a, and out of the housing 44 through drain cavity 43" and out through pipe 82, as shown by the direction of arrows 3. Pipe 82 returns the solder to the molten solder pump system. As a result, the deposition of particles in the solder onto the laminated tape is minimized. The particles are washed out of the channel means to minimize particle accumulation and buildup, and the formation of larger particle agglomerations. Particles large enough to cause excessive surface roughness, poor bonding of the laminate to the tape, or that alter the cross section so that the tape does not wind evenly are washed away by the counter-current molten solder flow. The flow of molten solder at notch 12 also provides for washing of particle buildup occurring at seal means 58. Wiper means 62 removes excess solder from the laminated tape, and smooths particles that are deposited on the tape. Preferably, wiper means 62 is formed from a compliant material such as silicone rubber so that minor size particles that do not affect the laminated tape performance pass through the compliant wiper means.

Wiper means 62 apply a force to laminated tape 40' to remove excess solder from the laminated tape. Additional pressure can be applied to wiping means 62 by conventional means (not shown) for applying a compressive force to wipers 62' such as electric servo motors, vacuum motors, or air activated grippers, for example available from PHD, Inc., Fort Wayne, Ind. Suitable air grippers are described in U.S. Pat. No. 4,607,873, incorporated by reference herein.

Although the apparatus above has three subchannels for solder joining three tapes, it should be understood that the apparatus of this invention can have fewer subchannels, i.e. two, or can have more subchannels, e.g. five or more, by either subtracting or adding additional inner tapered walls in the channel of the channel means.

What is claimed is:

1. An apparatus for solder joining metal tapes having a length, width, and thickness dimension comprising:
   a channel means having a base, and sidewall means extending therefrom to a cover extending over the sidewall means, the sidewall means define converging channels having an entrance end for admitting the tapes spaced apart, and an exit end where facing tape surfaces can come into contact, the sidewall means separating the base and cover by a distance selected to align the tapes in the width dimension, the cover having a first section extending from the exit end, and a second section extending from the first section to the entrance end, the second section being formed with a cavity facing the channel that permits a solder flow therethrough that minimizes accumulation of particles in the channels,
   a solder duct means mounted on the channel means for directing molten solder into the channels to flow from the exit end to the entrance end, the solder duct means having a slot extending therethrough and aligned with the exit end for permitting the tapes to pass therethrough;
   a seal means mounted on the solder duct means adjacent the slot for minimizing solder escaping from the slot while solder coated tapes pass therefrom; and
   a wiper means mounted on the solder duct means and positioned from the seal means for removing excess solder from tapes passing through the seal means.

2. An apparatus according to claim 1 wherein the converging channels are comprised of spaced subchannels converging into a single channel.

3. An apparatus according to claim 2 wherein the base has bores extending therethrough and in communication with the solder duct means to direct molten solder into the subchannels so that the molten solder wets both surfaces of tapes passing through the subchannels.

4. An apparatus according to claim 3 wherein the second section extends over the subchannels.

5. An apparatus according to claim 4 comprised of a drain means mounted on the duct means and positioned between the seal means and wiper means for draining solder passing from the seal means, the second drain means having heating means for maintaining a preselect temperature therein.

6. An apparatus according to claim 1 comprised of enclosing means for providing a preselected atmosphere over the channel means.

7. An apparatus according to claim 1 wherein the seal means and wiper means are compliant so that small particles having minimal effect on the tape performance can pass therethrough.

8. An apparatus according to claim 7 wherein the seal means and wiper means are formed from silicone rubber having a durometer hardness of at least about shore A 40, and resistant to temperatures of at least about 250° C.

* * * * *